United States Patent [19]
Kawashima et al.

[11] Patent Number: 5,428,580
[45] Date of Patent: Jun. 27, 1995

[54] NONVOLATILE SEMICONDUCTOR MEMORY HAVING AN ADDRESS-TRANSITION-DETECTION CIRCUIT

[75] Inventors: Hiromi Kawashima; Takao Akaogi, both of Kawasaki, Japan

[73] Assignee: Fujitsu Limited, Kawasaki, Japan

[21] Appl. No.: 176,431

[22] Filed: Jan. 3, 1994

[30] Foreign Application Priority Data

Jan. 14, 1993 [JP] Japan .................................. 5-004955

[51] Int. Cl.⁶ .............................................. G11C 7/00
[52] U.S. Cl. .................. 365/233.5; 365/201; 365/203; 365/226
[58] Field of Search ...................... 365/233, 233.5, 201, 365/203, 226, 227

[56] References Cited

U.S. PATENT DOCUMENTS

| | | | |
|---|---|---|---|
| 4,633,442 | 12/1986 | Borghese | 365/203 |
| 4,972,374 | 11/1990 | Wang et al. | 365/233.5 |
| 5,079,744 | 1/1992 | Tobita et al. | 365/201 |

Primary Examiner—Joseph A. Popek
Attorney, Agent, or Firm—Nikaido, Marmelstein, Murray & Oram

[57] ABSTRACT

The object of the present invention is to provide a nonvolatile memory wherein stored data can be properly read at power-on even if the memory is designed to achieve faster operating speeds by performing operations such as bit line charge-up by detecting an address signal change and the turning-on of the power. A nonvolatile semiconductor memory in which, after a write or an erase operation, a read operation for verification is performed by applying a voltage at a first verification level V2, which is lower than an applied voltage for a normal read operation, or a voltage at a second verification level V3, which is higher than the applied voltage V1, the nonvolatile semiconductor memory comprising: an address-transition-detection circuit 1; a supply voltage detection circuit 3 for generating an initialization transition signal at the rise of a supply voltage when the supply voltage has reached a first supply voltage transition threshold level V4 higher than the first verification level V2; and a transition operation circuit 2 for performing operations such as bit line charge-up in accordance with the address transition signal and initialization transition signal.

6 Claims, 10 Drawing Sheets

NONVOLATILE SEMICONDUCTOR MEMORY HAVING AN ADDRESS-TRANSITION-DETECTION CIRCUIT

BACKGROUND OF THE INVENTION (1) Field of the Invention

The present invention relates generally to electrically rewritable nonvolatile semiconductor memories (hereinafter simply referred to as nonvolatile memories) such as $E^2$PROMs, flash memories, and the like, and more particularly to a nonvolatile memory having an increased operating speeds and capable of providing accurate readout even at power-on.

(2) Description of the Related Art

Electrically rewritable nonvolatile memories include, for example, $E^2$PROM, and flash memory having total or selective total erasure capabilities. Flash memory has been attracting attention in recent years because of its high bit-density capabilities. The present invention is applicable to electrically rewritable nonvolatile memories of all types. In the following description, however, the flash memory is used as a representative example.

The nonvolatile memory cell has a two-layer gate structure consisting of a control gate and a floating gate, in which information storage is accomplished by utilizing the property that when prescribed voltages are applied to the control gate, drain, and source, the current flowing between the drain and the source varies depending on whether or not a charge is stored on the floating gate. Generally, in flash memories, injecting a charge into the floating gate is called writing, and extracting a charge from the floating gate is called erasure.

Usually, in flash memories, when data is rewritten, i.e., in data erase and write operations, in order to ensure the accuracy of the rewrite operation, a read operation is performed, for verification of the rewritten data, after performing the rewrite operation.

For flash memories, specifications are provided, such as the supply voltage limits within which proper operation of the device is guaranteed, and the guaranteed period and operating time for reliable retention of stored data. For the device to operate properly within the limits provided by the specification, it is required that the stored data have such a margin that it can be read out correctly under the worst conditions. Also, to guarantee the reliable retention of the stored data for long periods of time, the data needs to be provided with such a margin as to prevent the evaluation of its logic value from being affected by any change that may occur under the worst conditions during the retention period thereof, such changes including charge leakage and charge injection that may occur on the floating gate, whatever the cause.

Therefore, in flash memories, stricter conditions are placed on the voltage applied to the control gate for the verify operation than for normal operations, to confirm that the rewritten data has a reliable margin. More specifically, in a write verify operation, the voltage applied to the control gate is set at about 6.5 V, which is higher than the voltage normally applied, and it is determined whether the logic value "L" can still be output at that voltage. In an erasure verify operation, the voltage applied to the control gate is set at about 3.5 V, which is lower than the voltage normally applied, and it is determined whether the logic value "H" can still be output at that voltage. The voltage applied to the control gate for a verify operation is called the verify voltage, and in this specification also, this term is used.

As efforts continue to produce higher density flash memories, the memory cell size is becoming increasingly smaller, which tends to cause the memory cell driving capabilities to drop. On the other hand, higher operating speeds are demanded of the device. One approach to addressing this demand is to employ a method of increasing operating speeds, widely used in asynchronous memories, which involves performing operations such as bit line charge-up after detecting an address signal change. An address-transition-detection circuit (hereinafter referred to the ATD circuit) is used to detect an address signal change.

Furthermore, nonvolatile memories such as flash memories are required, by the nature of their characteristics, to ensure proper data readout at power-on in accordance with the input conditions set at that time, which requires that the same operation performed when an address signal change has occurred be performed when the turning on of the power is detected.

When a flash memory is equipped with an ATD circuit and designed to perform the same operation when power is turned on as when an address signal change has occurred, a problem specific to flash memory will arise because flash memory is erasable. Generally, the supply voltage level detected as power-on is about 3 V.

On the other hand, the verify voltage for erasure is about 3.5 V. This means that a memory cell verified as erased in a verify operation may output data "L" at the time of power-on if the threshold voltage is somewhere between 3 V and 3.5 V. That is, the memory cell, though it has been erased, may be judged as being in a written state. Such an error is a serious problem as it degrades the reliability of the memory device.

SUMMARY OF THE INVENTION

The object of the present invention is to provide a flash memory in which prescribed operations such as bit line charge-up are performed by detecting an address signal change and the turning on of power, and which ensures that the stored data can be properly read out at the time of power-on.

In a nonvolatile semiconductor memory according to the present invention, a verify-read operation is performed after a write or an erase operation, to verify whether the read or the erase operation has been accomplished accurately; in the verify-read operation, reading is done by applying a first verification level voltage, which is lower than the supply voltage applied in a normal read operation, or a second verification level voltage, which is higher than the normal supply voltage, thus verifying the accuracy of the write or the erase operation by performing the operation at a higher or lower level. To achieve the above object, the nonvolatile semiconductor memory of the invention is characterized by the inclusion of an address-transition-detection circuit 1 for generating an address transition signal by detecting a change in an address signal, a supply power detection circuit 3 for generating an initialization transition pulse when the supply voltage at power-on has reached a first supply power transition threshold level that is higher than the first verification level, and a transition operation circuit 2 for performing prescribed operations such as bit line charge-up in accordance with the address transition signal and the initialization transition signal.

The voltage levels are, in the order of decreasing magnitude, the second verification level, the supply voltage, the supply power transition threshold level, and the first verification level. In an ordinary flash memory, the first verification level corresponds to the verify voltage for erasure, and the second verification level corresponds to the verify voltage for write. Thus, the verify voltage for erasure is set at a lower level than the supply power transition threshold level. Accordingly, when the voltage of the power transition threshold level is applied to the control gate for power-on read, since the erasure was verified at the verify voltage lower than that, an erased memory cell will be judged, without fail, as being in an erased state at the time of power on.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before proceeding to a detailed description of the preferred embodiments of the present invention, prior art nonvolatile semiconductor memories will be described, with reference to the accompanying drawings relating thereto, for a clearer understanding of the differences between the prior art and the present invention.

Figure 1:
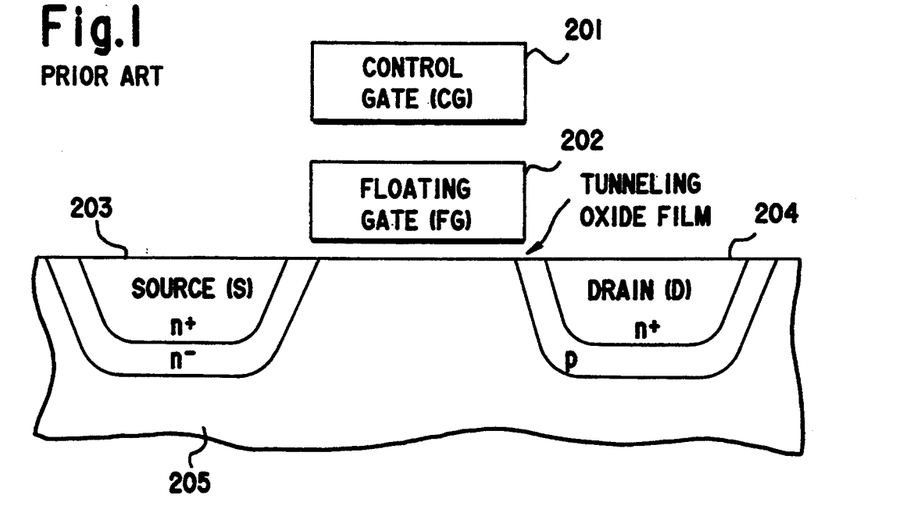
FIG. 1 is a diagram showing the memory cell structure of a flash memory.

FIG. 1 is a diagram showing an example of a memory cell structure for a flash memory. Throughout the drawings, the same functional elements are designed by the same reference numerals, and explanation of such elements is not necessarily repeated for every drawings.

As shown, the memory cell has a two-layered gate structure consisting of a control gate (CG) 201 and a floating gate (FG) 202, in which information storage is accomplished by utilizing the property that when prescribed voltages are applied to the control gate 201, drain (D) 204, and source (S) 203, the current flowing between the drain 202 and the source 203 varies depending on whether or not a charge is stored on the floating gate 202. Generally, in flash memories, a logic value "High" represents the erased state, i.e. the state in which no charge is stored on the floating gate 202, and a logic value "Low" represents the state in which a charge is stored on the floating gate 202. Injecting charge into the floating gate 202 is called writing.

Figure 2A:
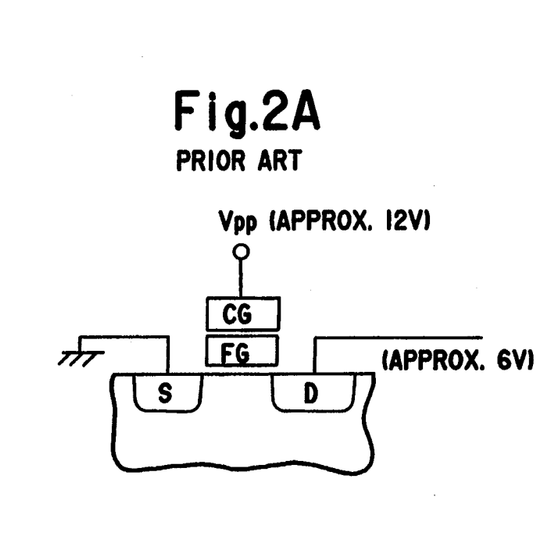
FIGS. 2A to 2C are diagrams respectively showing read, write, and erasure methods for the flash memory.
Figure 2B:
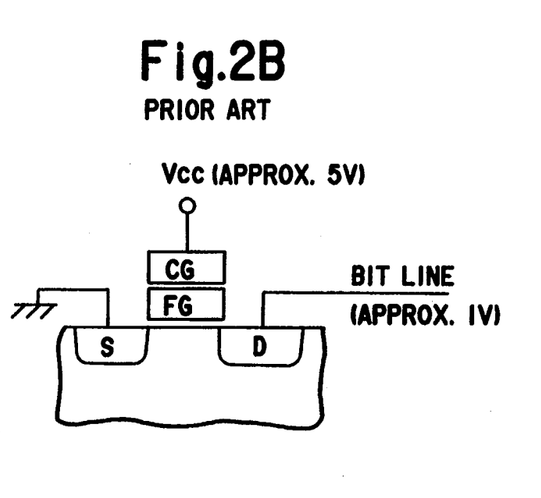
Figure 2C:
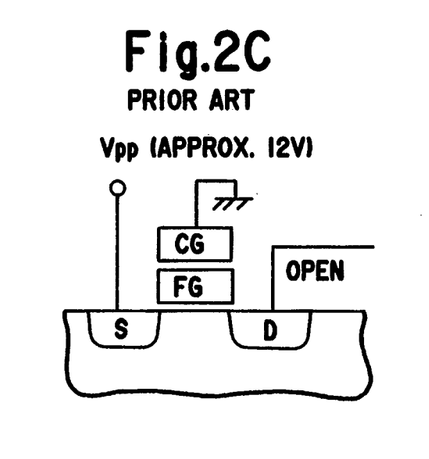

The following describes how information write, read, and erase operations are performed on the memory cell having the structure shown in FIG. 1. FIGS. 2A to 2C show the conditions of voltages applied to the various portions of the flash memory cell for information read, write, and erase operations: (1) for a write operation, (2) for a read operation, and (3) for an erase operation.

For writing, a high voltage $V_{PP}$ (about 12 V) is applied to the control gate (CG), about 6 V to the drain (D), and 0 V to the source (S). Under these conditions, electrons flowing through the memory cell encounter a high electric field near the drain (D), and some of the electrons are accelerated by this field and gain enough energy to overcome the energy barrier of the gate insulating film and drift to the floating gate (FG) for injection. Since the floating gate (FG) is electrically isolated from other circuit regions, the injected charge can be stored therein semipermanently.

For reading, a supply voltage $V_{CC}$ (about 5 V) is applied to the control gate (CG), about 1 V to the drain (D), and 0 V to the source (S). The threshold voltage of the cell transistor varies depending on the presence or absence of charge on the floating gate (FG), so that the current flowing through the selected memory cell varies accordingly. By sensing and amplifying this current, the information is read out.

For erasure, 0 V is applied to the control gate (CG), the high voltage $V_{PP}$ (about 12 V) to the source (S), and the drain (D) is left open. With this, the charge is removed from the floating gate (FG) and drawn to the source (S).

Figure 3:
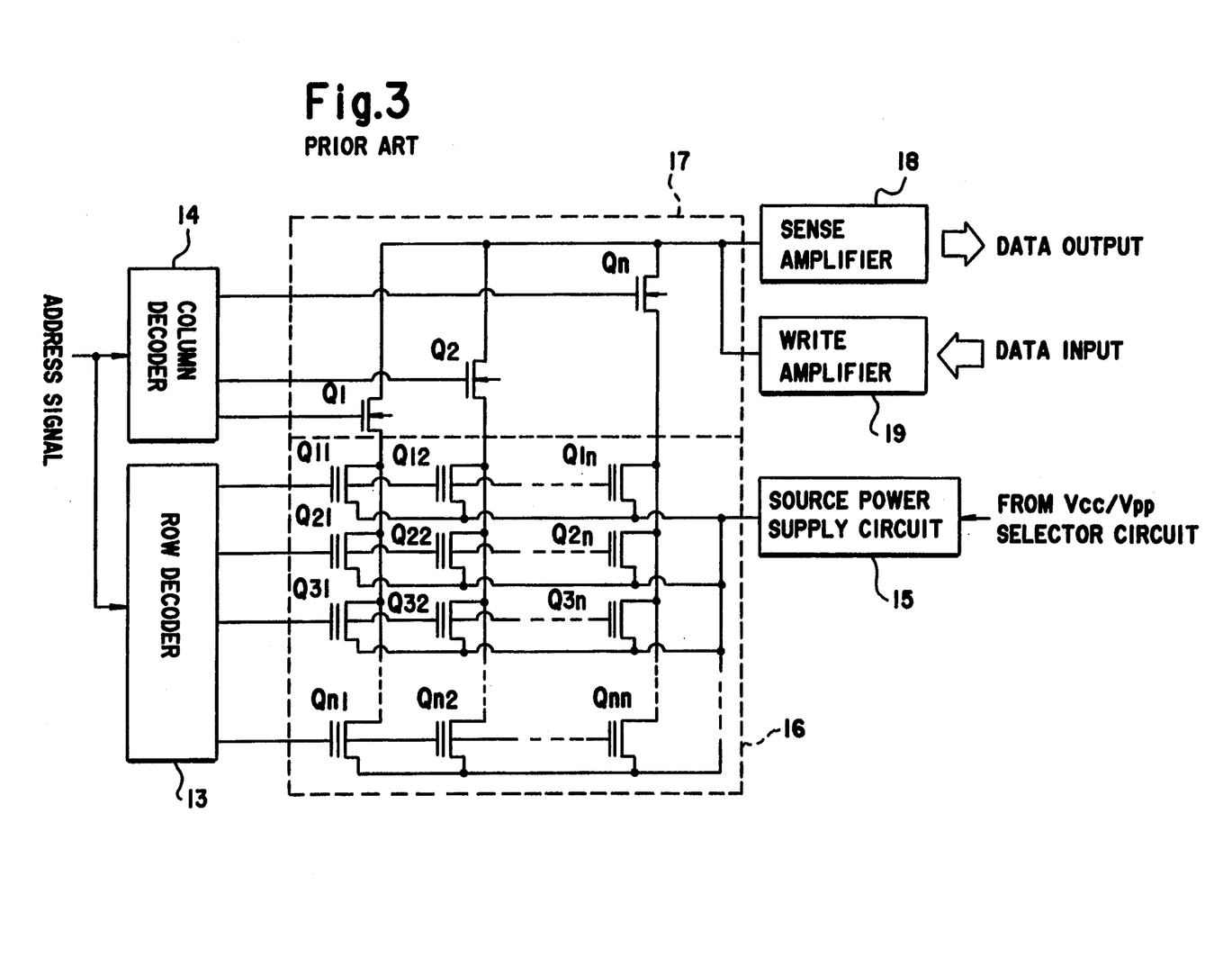
FIG. 3 is a diagram showing the circuit configuration of a prior art flash memory.

FIG. 3 is a diagram showing a cell block of the flash memory with its peripheral circuitry. It will be noted that, in the drawing, the same functional elements are designated by the same reference numerals for both the prior art and an embodiment of the invention.

In FIG. 3, the reference numeral 13 is a row decoder for selectively controlling word lines; 14 is a column decoder; 15 is a source power supply circuit; 16 is a cell matrix; 17 is a column gate consisting of transistors $Q_k$ that are driven by a bit line select signal from the column decoder 14; 18 is a sense amplifier; and 19 is a write amplifier. Further, $Q_{ij}$ represents a memory cell in a matrix array of memory cells; each transistor $Q_k$ controls the connection between the associated bit line and the sense amplifier.

The control gate 201 of each memory cell is connected to a word line extending from the row decoder 13, while the drain 204 is connected to the bit line and the source 203 is connected to the source power supply circuit 15. An actual flash memory contains a plurality of such cell blocks.

The row decoder 13 decodes an address signal and applies the row address signal to the selected word line, while the column decoder 14 decodes an address signal and outputs a bit line select signal to selectively energize the transistors $Q_k$. Access is then made to the memory cell connected to the thus selected word line and bit line. Erasure is accomplished by applying a high voltage from the source power supply circuit 15 to the source line to which the memory cells are connected common. Thus, the memory cells connected common to the same source line are all erased at one time.

As described above, in flash memories, when data is rewritten, i.e., in data erase and write operations, in order to ensure the accuracy of the rewrite operation, a read operation is performed for verification of the rewritten data after performing the rewrite operation. In the write operation, after a logic value "Low" is written, the data is read out to confirm that the logic value is "Low"; in the erase operation, after a logic value "High" is written in to erase the previous data, all the memory cells erased together are read out to confirm that the logic value stored in each cell is "High". The rewrite operation is complete when the verification is finished successfully; on the other hand, if the verification has failed, the rewrite operation is repeated and the verify operation is performed once again. Such a verify operation is either performed by external control or automatically initiated using internal circuitry contained in the flash memory.

Further, for the device to operate properly within the limits provided by the specification, it is required that the stored data have such a margin that it can be read out correctly under the worst conditions.

Figure 4:
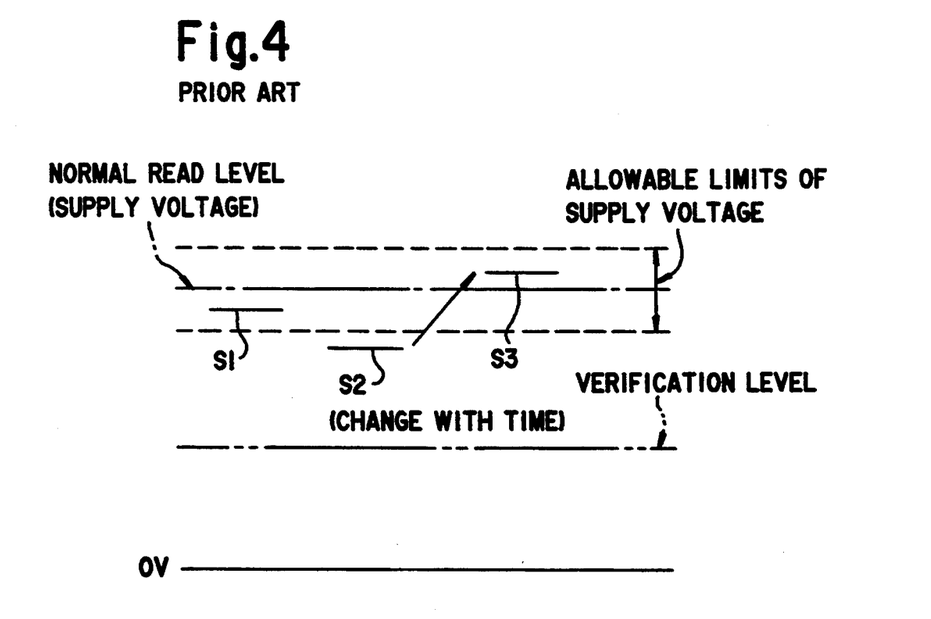
FIG. 4 is a diagram showing the setting of an erasure margin and a verify voltage.

FIG. 4 is a diagram which explains, by taking an erase operation as an example, the effects of the change that may occur under the worst conditions during the retention period and the necessary margin to compensate for such a change.

When the voltage applied to the control gate (CG) is varied under the conditions shown in FIG. 2B for a read operation, and the threshold voltage of the control gate voltage is examined, it will be shown that, in a flash memory, the threshold voltage has a given relationship to the amount of charge stored on the floating gate. This means that the threshold voltage of the control gate voltage indicates the state of the charge stored on the floating gate.

Usually, reading is accomplished by applying the supply voltage to the control gate. When the allowable supply voltage limits are defined by the dotted lines shown in FIG. 4, if the threshold voltage of the memory cell is at the level indicated by S1, the logic value "High" will be output by applying a voltage just intermediate between the upper and lower limits of the allowable supply voltage range; however, if the lower limit voltage in the allowable range is applied for reading, a logic value "Low" will be output. Suppose here that the threshold voltage of the memory cell has changed with time from the initial level S2 to the final level S3. Initially, "High" was output even when the lower limit of the supply voltage was applied, but after the change, "Low" will be output even if the intermediate voltage within the allowable supply voltage limits is applied for reading.

Therefore, in flash memories, in order to avoid the above problem, a stricter condition is placed on the voltage applied to the control gate for the verify operation than for the normal operations, to confirm that the rewritten state has a reliable margin.

Usually, a series of verify operations, including generation and application of the verify voltage, are automatically performed using internal circuitry.

Figure 5:
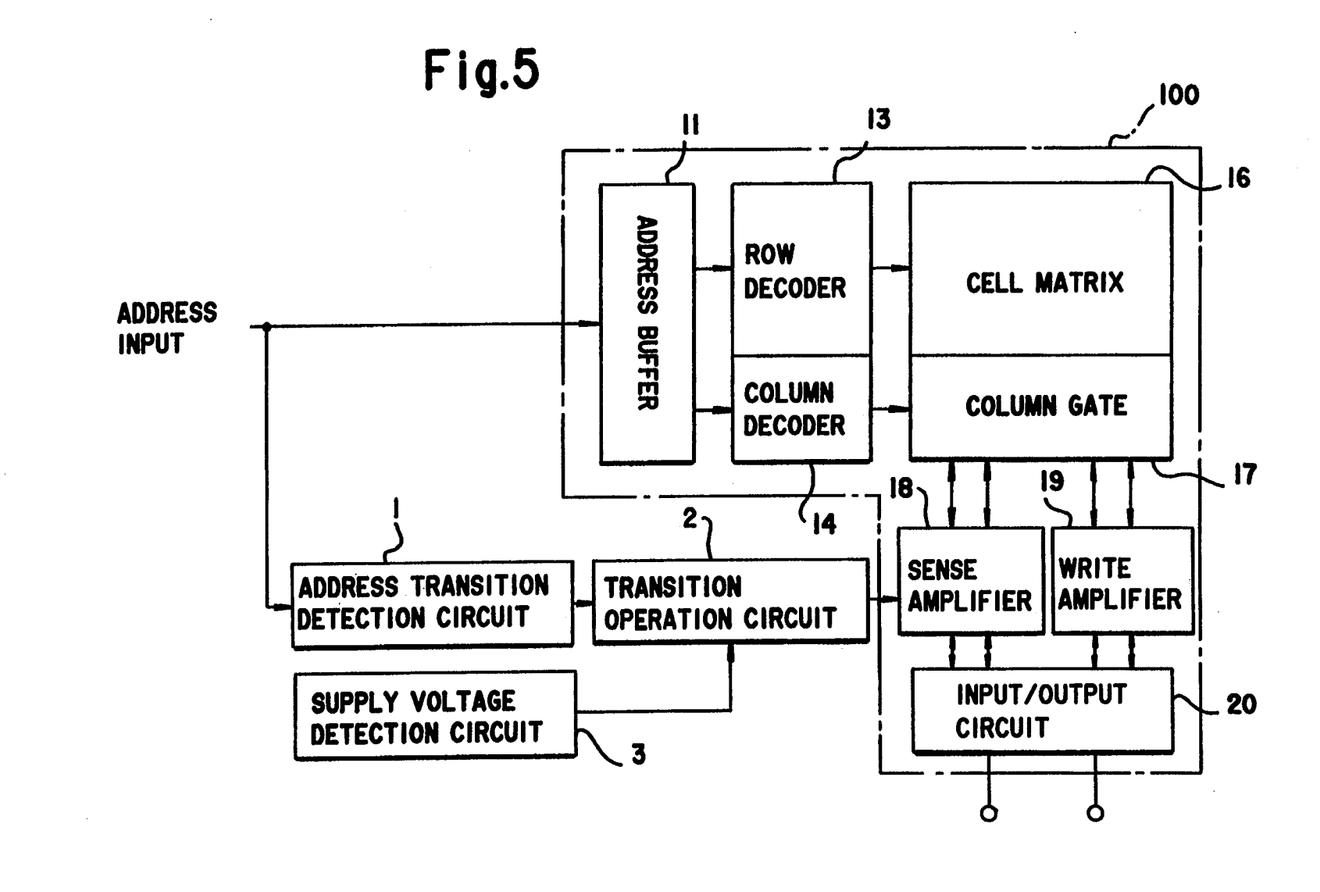
FIG. 5 is a diagram showing the basic configuration of a flash memory according to the invention.

FIG. 5 is a diagram showing the basic configuration of a nonvolatile semiconductor memory according to the present invention.

In FIG. 5, the reference numeral 100 indicates a section identical to the one included in the prior art nonvolatile semiconductor memory, and comprises an address buffer 11, a row decoder 13, a column decoder 14, a cell matrix 16, a column gate 17, a sense amplifier 18, a write amplifier 19, and an input/output circuit 20. Furthermore, in the illustrated nonvolatile semiconductor memory, a verify-read operation is performed after a write or an erase operation, to verify whether the read or the erase operation has been accomplished accurately; in the verify-read operation, reading is done by applying to a prescribed portion a voltage of a first verification level, which is lower than the supply voltage applied in a normal read operation, or a voltage of a second verification level, which is higher than the normal supply voltage, thus verifying the accuracy of the write or the erase operation by performing the operation to a higher or lower level.

To achieve the above object, the nonvolatile semiconductor memory of the invention is characterized, as shown in FIG. 5, by the inclusion of an address-transition-detection-circuit 1 for generating an address transition signal by detecting a change in an address signal, a supply voltage detection circuit 3 for generating an initialization transition pulse when the supply voltage at power-on has reached a first supply voltage transition threshold level that is higher than the first verification level, and a transition operation circuit 2 for performing prescribed operations such as bit line charge-up in accordance with the address transition signal and the initialization transition signal.

Figure 6:
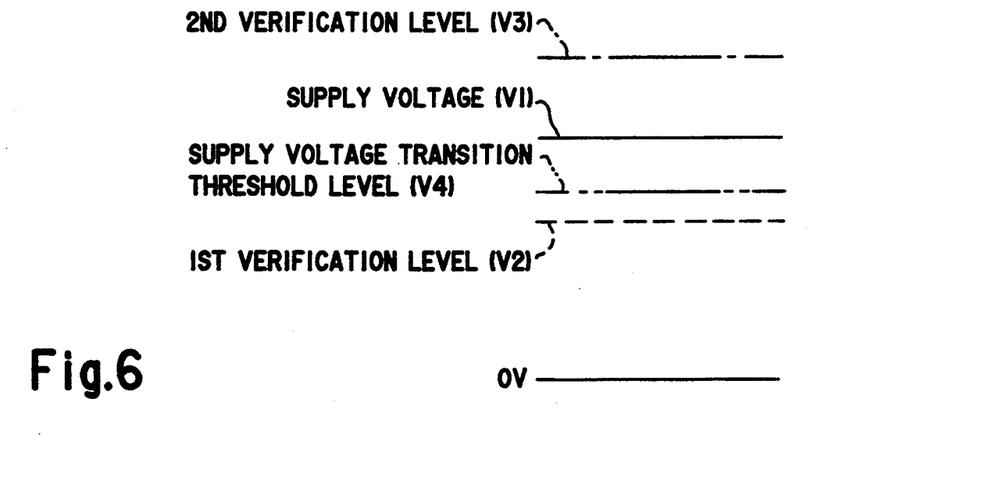
FIG. 6 is a diagram showing the relationships between various voltage levels for the flash memory of the invention.

FIG. 6 is a diagram illustrating the relationships among the various voltage levels according to the invention.

The voltage levels are, in the order of decreasing magnitude, as shown in FIG. 6, the second verification level V3, the supply voltage V1, the supply power transition threshold level V4, and the first verification level V2. In an ordinary flash memory, the first verification level V2 corresponds to the verify voltage for erasure, and the second verification level V3 corresponds to the verify voltage for write. Thus, the verify voltage for erasure is set at a lower level than the supply voltage transition threshold level V4. Accordingly, when the voltage of the voltage transition threshold level V4 is applied to the control gate for power-on read, since the erasure was verified at the verify voltage lower than the voltage transition threshold level V4, the erased memory cell will be judged, without fail, as being in an erased state at the time of power on, and the logic value "High" will be output.

Figure 7:
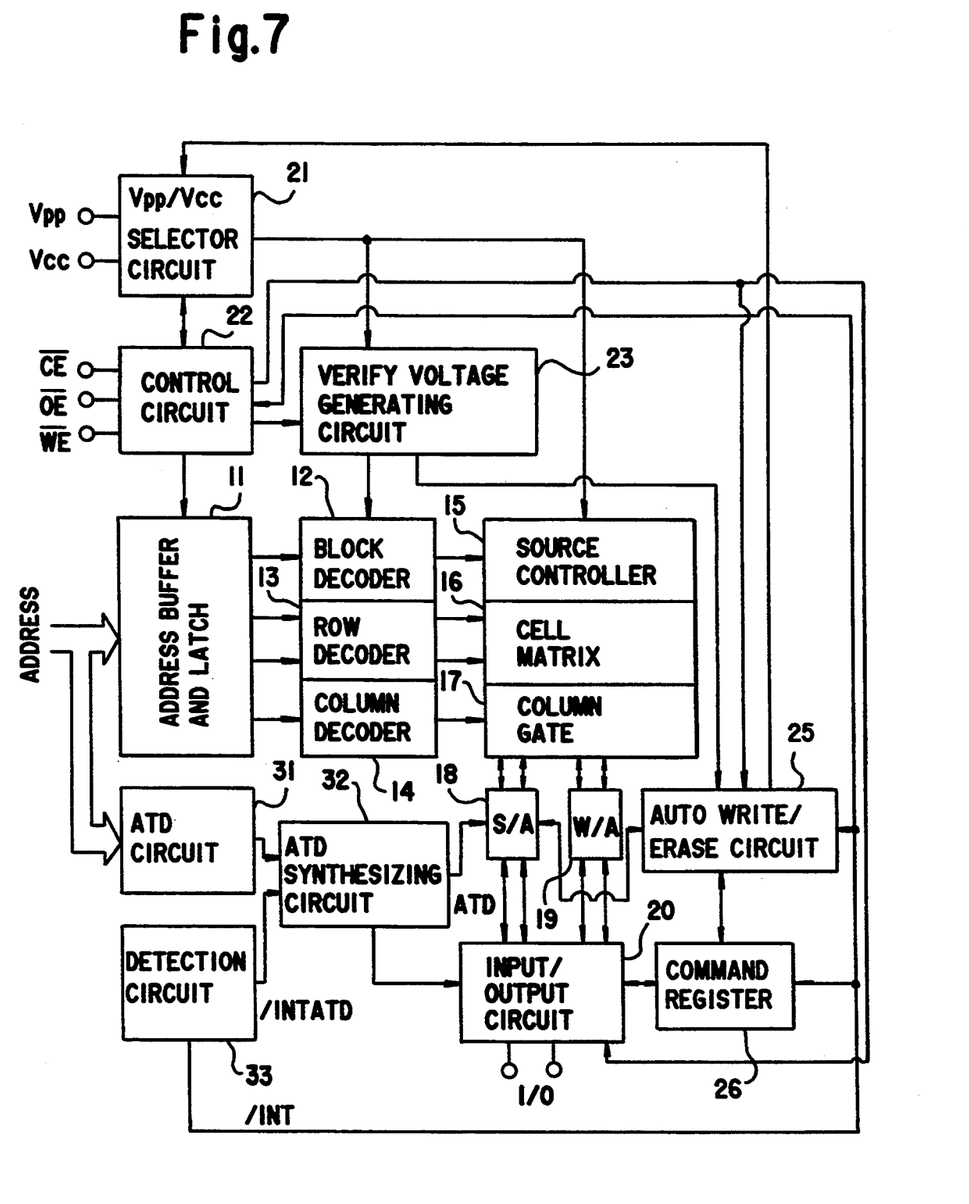
FIG. 7 is a block diagram showing an entire construction of one embodiment of the invention.

FIG. 7 is a diagram showing the entire construction of one embodiment of the invention.

In FIG. 7, the reference numeral 11 indicates an address buffer and latch to which an address signal is input, and 12 indicates a block decoder which decodes the address signal for each cell matrix consisting of a plurality of blocks. The numeral 13 indicates a row decoder, 14 indicates a column decoder, 15 indicates a source controller, 16 indicates a cell matrix consisting of a plurality of blocks, 17 indicates a column gate, 18 indicates a sense amplifier, 19 indicates a write amplifier, and 20 indicates an input/output circuit. The numeral 21 indicates a $V_{PP}/V_{CC}$ selector circuit for switching the voltage between an external supply voltage $V_{CC}$ and a high voltage $V_{PP}$ for application to a indicated portion in accordance with the operation mode. As shown in FIG. 2, a high voltage must to be applied to the indicated portion for writing or erasure, and the high voltage $V_{PP}$ is supplied when performing a write or an erase operation. The numeral 22 indicates a control circuit for controlling the various portions of the device in accordance with external control signals, /CE (chip-select signal), /OE (read-enable signal), and /WE (write-enable signal). The numeral 23 indicates a verify voltage generating circuit which generates verify voltages for write and erase operations from the voltage $V_{PP}$ and which switches the voltage applied to the decoder and sense amplifier between the verify operation and other operations. The numeral 25 is an automatic write/erase verify circuit which automatically performs a verify operation after a write or an erase operation to verify the rewritten data. The numeral 26 indicates a command register for storing the necessary commands for various operations. The above-described configuration is the same as that of the prior art flash memory.

The numeral 31 is an address-transition-detection-circuit (ATD circuit) which detects a change in an address signal and generates an address transition signal pulse. The numeral S3 is a $V_{CC}$ detection circuit which detects the turning on of the supply voltage $V_{CC}$ and which generates a supply voltage transition detection signal that rises when the supply voltage $V_{CC}$ reaches the supply voltage transition threshold level. The numeral 32 is an ATD synthesizing circuit which outputs an ATD signal to the sense amplifier 18 in response to the address transition signal or the supply voltage transition detection signal. The sense amplifier 18 performs a bit line charge-up operation in response to the ATD signal.

Figure 8:
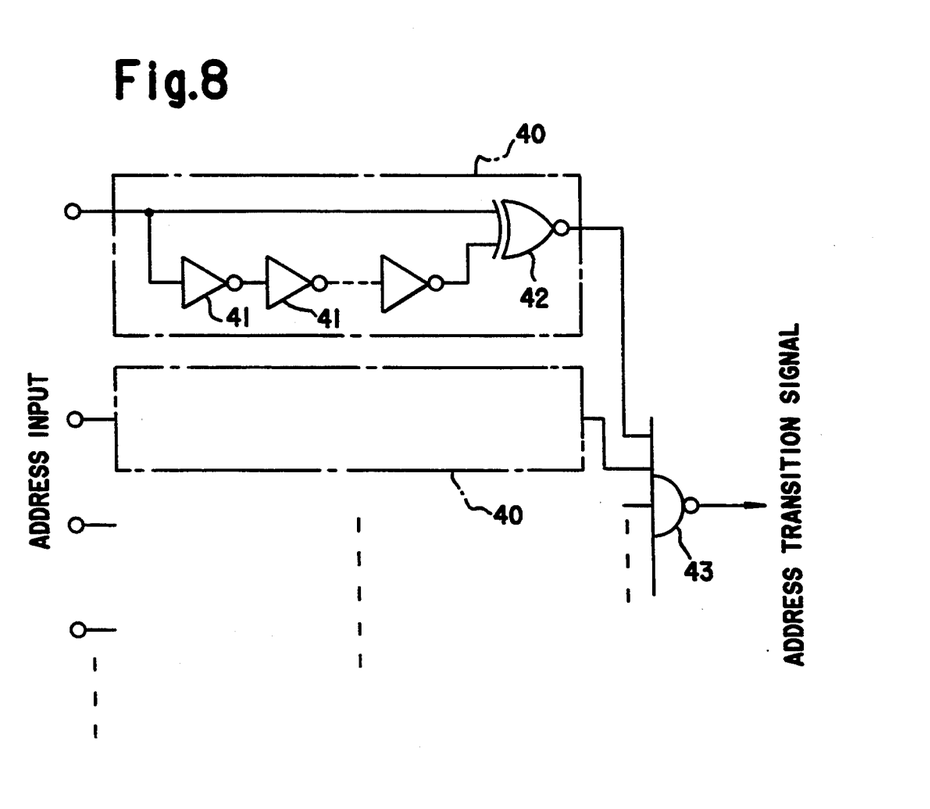
FIG. 8 is a diagram showing an address-transition detection-circuit according to the embodiment.

FIG. 8 is a diagram showing an example of the address-transition-detection circuit (ATD circuit). The ATD circuit is widely used in memory devices, and its construction is well known. Each circuit 40 generates a pulse-like signal when a change occurs in a bit line address signal. The numeral 41 indicates an array of inverters for delaying the input signal. The delayed signal is compared with the undelayed signal; if they match, it means that there is no change in the signal, and if they do not match, it means that a change has occurred in the signal. An EXNOR gate 42 is provided to detect a match between the two signals and determine whether there has been a change in the signal.

The ATD circuit contains the same number of such circuits 40 as the number of address bits. Their outputs are applied to the inputs of a NAND circuit 43 which thus produces an address transition signal when a change in the address signal has occurred.

Figure 9:
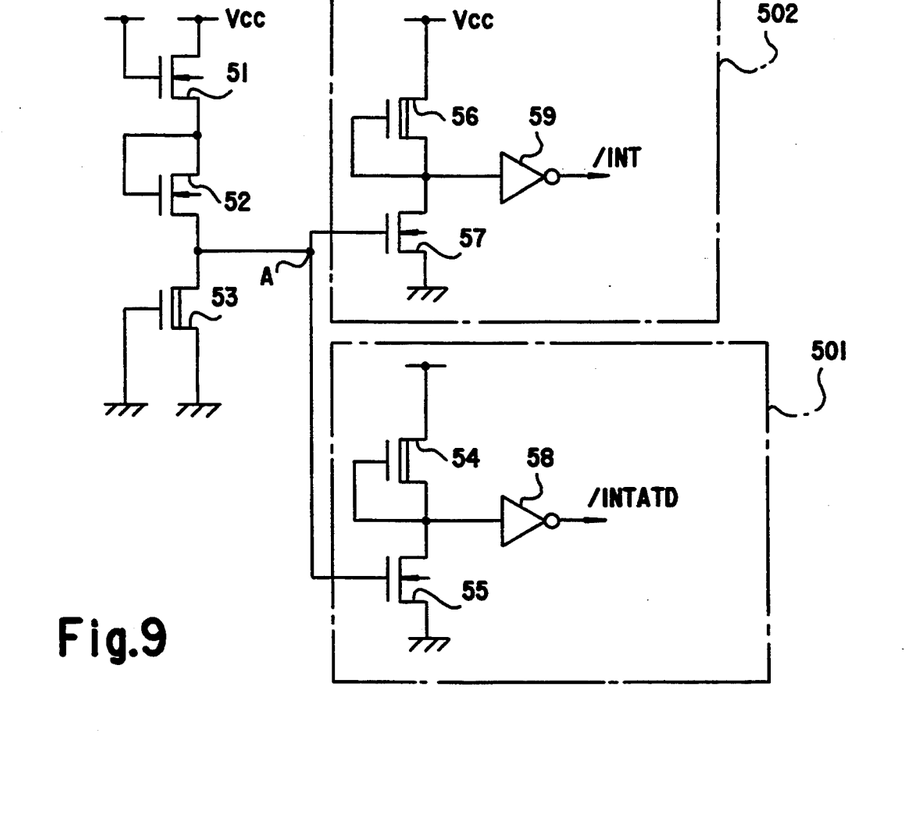
FIG. 9 is a diagram showing a supply voltage ($V_{CC}$) detection circuit according to the embodiment.

FIG. 9 is a diagram illustrating the supply voltage ($V_{CC}$) detection circuit. In FIG. 9, the numerals 51, 52, 55, and 57 are n-channel transistors, and 53, 54, and 56 are depletion-mode n-channel transistors. The numerals 58 and 59 are inverter gates. The numeral 501 is a first supply-voltage-transition detection circuit, and 502 is a second supply-voltage-transition detection circuit.

Figures 10A, 10B:
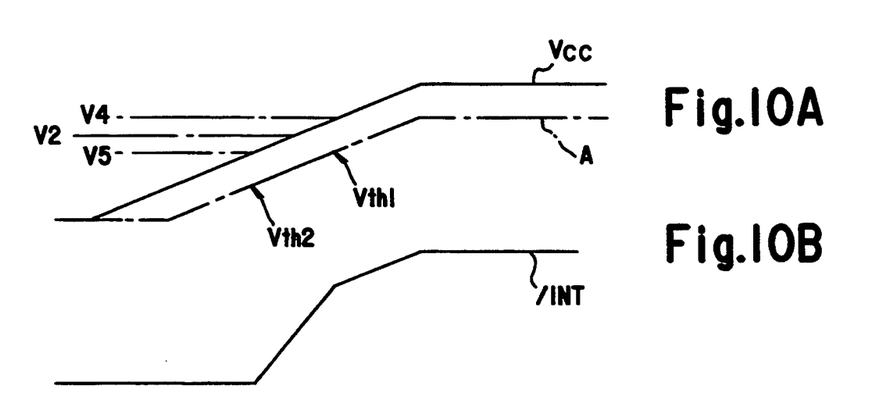
FIG. 10 is a timing chart illustrating the operation of the supply voltage ($V_{CC}$) detection circuit according to the embodiment.
Figure 10C:
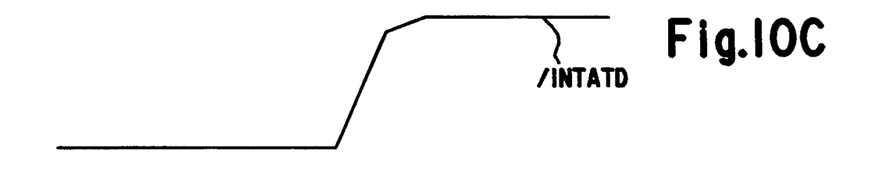

In this embodiment, the operations performed upon the detection of a change at power on are classified into two types, which will be described hereinafter: the bit line charge-up operation performed by the sense amplifier 18, and other operations. The first supply voltage transition detection circuit 501 outputs a signal /IN-TATD for initiating the bit line charge-up operation, and the second supply voltage transition detection circuit 502 outputs a signal /INT for initiating the other operations. The supply voltage transition threshold levels for the respective operations are thus made different. As shown, the first supply voltage transition detection circuit 501 and the second supply voltage transition detection circuit 502 have the same circuit configuration, except that the threshold voltages of the transistors 55 and 57 are different. FIG. 10 is a timing chart for explaining the operation of the supply voltage detection circuit of FIG. 9. The operation of the supply voltage detection circuit of FIG. 9 will be described below with reference to FIG. 10.

When the supply voltage $V_{CC}$ changes as shown in FIG. 10, the voltage at node A in FIG. 9 changes as shown in the diagram. Let the threshold voltage of the transistor 55 in the first supply voltage transition detection circuit 501 be denoted by Vth1, and the threshold voltage of the transistor 57 in the second supply voltage transition detection circuit 502 be denoted by Vth2, Vth1 being higher than Vth2. Then, the output /INT of the second supply voltage transition detection circuit 502 begins to rise when the voltage at node A reaches Vth2, i.e. when the supply voltage $V_{CC}$ reaches the voltage level V5; on the other hand, the output /IN-TATD of the first supply voltage transition detection circuit 501 begins to rise when the voltage at node A reaches Vth1, i.e. when the supply voltage $V_{CC}$ reaches the voltage level V4. The voltage level V5 is chosen to be lower than the erasure verify voltage V2, while the voltage level V4 is chosen to be higher than the erasure verify voltage V2. Since reading at power-on is initiated in response to the signal /INTATD, the supply voltage at the time of the power-on reading is higher than the verify voltage, so that the data can be read out correctly.

Furthermore, prior to the initiation of the power-on reading, the signal /INT is output to put the various elements in standby state, which not only ensures further enhancement of the readout accuracy at power-on but makes write errors, i.e. writing of erroneous data, less likely.

Figure 11:
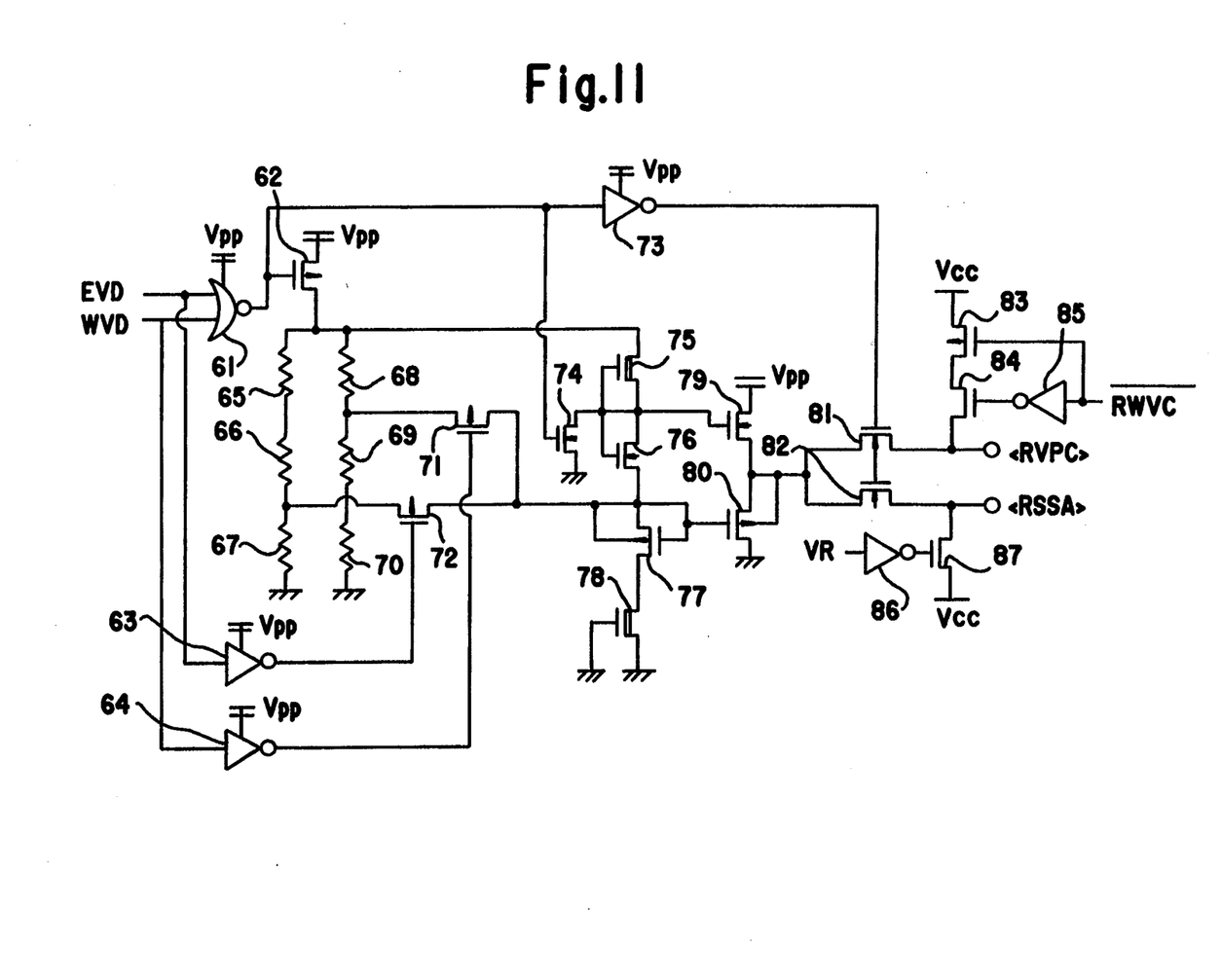
FIG. 11 is a diagram showing a verify voltage generating circuit according to the embodiment.

FIG. 11 is a diagram showing the configuration of the verify voltage generating circuit 23. The verify voltage generating circuit is also used in the prior art flash memory, and a detailed description thereof is therefore not given herein. In the illustrated circuit, the high voltage $V_{PP}$ supplied for write or erase operations is divided through resistors 65–70 to produce the verify voltages; the appropriate verify voltage is output for a verify operation, and the supply voltage $V_{CC}$, which is applied to its output section, is output for other operations.

In the circuit of FIG. 11, a signal EVD is set to "High" for erasure verify, a signal WVD is set to "High" for write verify, a signal VR is set to "High" for erasure or write verify, and /RWVC is "Low" for normal read operations. An output PSSA produces a verify voltage for a verify operation and the supply voltage $V_{CC}$ for other operations. An output RVPC produces the verify voltage for a verify operation and the supply voltage $V_{CC}$ for normal read operations. RVPC and PPSA are supplied to the row decoder 13 and sense amplifier 18, respectively.

Figure 12:
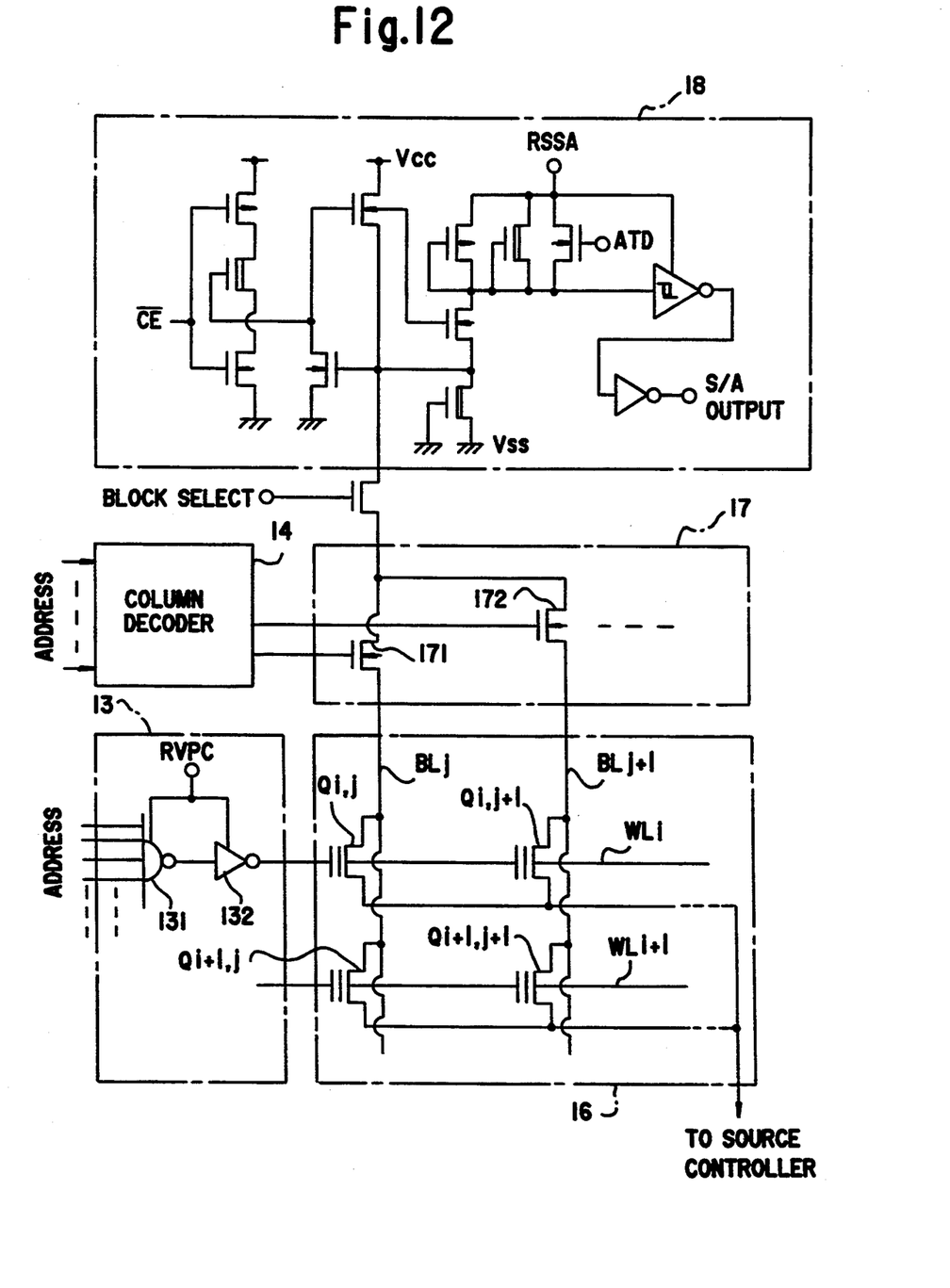
FIG. 12 is a diagram showing a sense amplifier and a row decoder according to the embodiment.
Figure 13A:
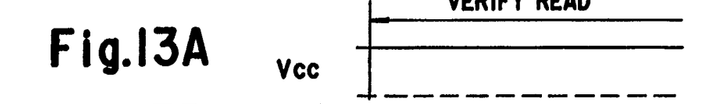
FIG. 13 is a timing chart illustrating the operations of the embodiment.
Figure 13B:
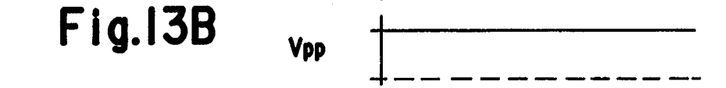
Figure 13C:
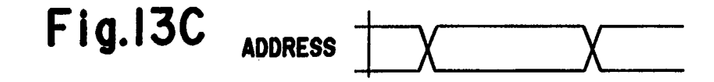
Figure 13D:
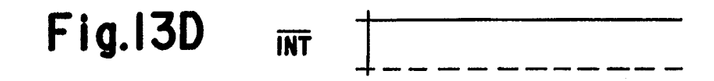
Figure 13E:
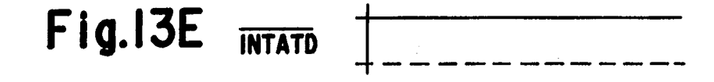
Figure 13F:
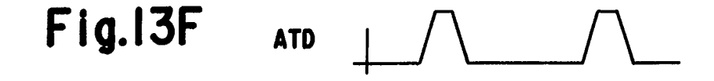
Figure 13G:
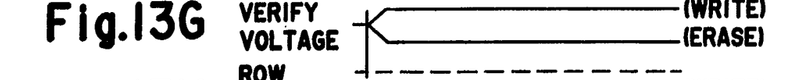
Figure 13H:
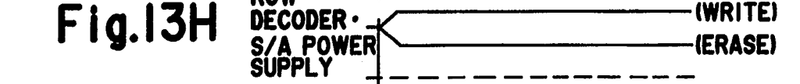
Figure 13I:
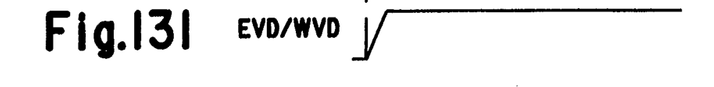
Figure 13J:
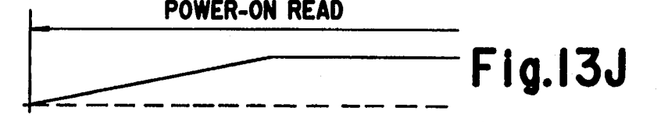
Figure 13K:
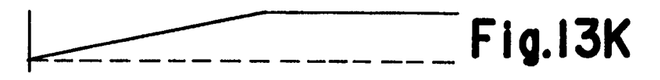
Figure 13L:
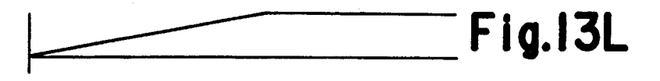
Figure 13M:
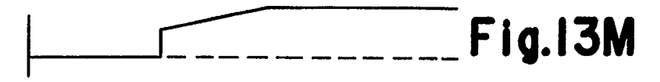
Figure 13N:
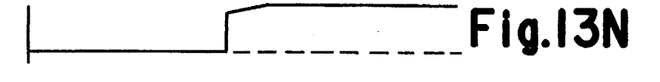
Figure 13O:
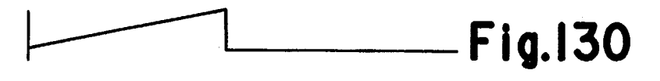
Figure 13P:
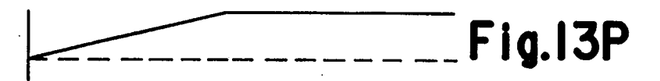
Figure 13Q:
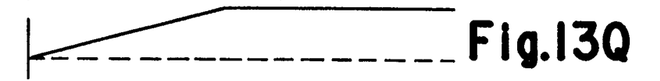

FIG. 12 shows the circuit configuration of the row decoder 13, column decoder 14, cell matrix 16, column gate 17, and sense amplifier 18. The circuit configuration is fundamentally the same as the corresponding circuits of the prior art flash memory, and the following description deals only with the differences from the prior art configuration.

As shown, the voltage RVPC is the power supply for the row decoder 13. The voltage PSSA is the power supply for the sense amplifier 18. The ATD signal from the ATD synthesizing circuit 32 is applied, as indicated in the figure, to the sense amplifier 18. When this ATD signal is applied, the bit line is charged up. This reduces the time available for amplitude variation at the time of reading, and thus increases the operating speed.

FIG. 13 is a timing chart for the various signals according to this embodiment. The reading operations in this embodiment will be described below with reference to this timing chart. The normal read operation is the same as the verify-read operation, except that the voltage applied to the control gate is different. The following description deals with the verify-read operation.

In the verify-read operation, the supply voltage $V_{CC}$ and voltage $V_{PP}$ are kept constant, so that the signals /INT and /INTATD output from the supply voltage detection circuit 33 remain "High". When the verify operation is initiated, EVD or WVD shown in FIG. 11, whichever is appropriate for the kind of operation, rises in response to which even verify voltages RVPC and PSSA are output, and EVD or WVD is applied to the indicated points of the row decoder 13 and the sense amplifier 18. In this situation, when the address signal changes, the ATD circuit 31 outputs an address transition detection signal and the ATD synthesizing circuit 32 outputs an ATD signal. After the bit line is charged up in response to this signal, data is read out of the accessed memory cell.

For power-on reading, the supply voltage $V_{CC}$ and voltage $V_{PP}$ change as shown in the diagram. In response to these changes, EVD and WVD remain "Low", and the address signal changes to provide the indicated value. The voltage output as the verify voltage at this time is the supply voltage $V_{CC}$, and the verify voltage and the voltage applied to the row decoder and sense amplifier also change in the same manner as the supply voltage $V_{CC}$. /INT and /INTATD change as shown in FIG. 10, in accordance with which the ATD signal changes as shown in the diagram. Reading is done in synchronism with the rise of the ATD signal. Since the supply voltage at this time is higher than the erasure verify voltage, as previously described, reading is accomplished correctly.

Since proper reading cannot be done until the supply voltage reaches the first supply voltage transition threshold level and the supply voltage detection circuit outputs /INTATD, it is desirable that the output be placed in a high impedance state, to prevent the output from being read out erroneously.

The above description has dealt with an example in which the flash memory is equipped with an ATD circuit and operations such as bit line charge-up are performed in accordance with its output. However, in some flash memories not equipped with an ATD circuit, reading is performed by detecting the turning on of the supply power. In that case also, by prohibiting the read operation until the supply voltage reaches a supply voltage transition threshold level which is higher than the verify voltage and the supply voltage detection circuit outputs a signal signifying the turning on of the power, erroneous data are prevented from being output at the time of power on. In that case also, it is desirable that the output be put in a high impedance state until the readout data are output.

As described above, in a flash memory in which rewrite verify operations are performed under stricter conditions than in normal operations to provide rewritten data with a reliable margin, the invention provides the effect that the stored data can be read out correctly at the time of power-on even if the flash memory is so designed to perform prescribed operations such as bit line charge-up by detecting a change in an address signal and the turning on of the power.

We claim:

1. A nonvolatile semiconductor memory whose contents are electrically rewritable, and in which a read operation for verification is performed after an erase operation to verify whether the operation has been accomplished correctly, the read operation for verification after the erase operation being done by applying to a indicated portion a voltage of a first verification level, which is lower than a supply voltage applied in a normal read operation, said nonvolatile semiconductor memory comprising:
   an address-transition-detection circuit for generating an address transition signal by detecting a change in an address signal;
   a supply voltage detection circuit for generating an initialization transition signal when said supply voltage at power-on has reached a first supply voltage transition threshold level that is higher than said first verification level; and
   a transition operation circuit for performing prescribed operations such as bit line charge-up in accordance with said address transition signal and said initialization transition signal.

2. A nonvolatile semiconductor memory according to claim 1, wherein said supply voltage detection circuit comprises a first supply voltage transition detection circuit for generating an initialization transition signal when said supply voltage at power-on has reached said first supply voltage transition threshold level, and a second supply voltage transition detection circuit for generating an initialization signal when said supply voltage has reached a second supply voltage transition threshold level that is lower than said first supply voltage transition threshold level, said first verification level being intermediate between said first supply voltage transition threshold level and said second supply voltage transition threshold level.

3. A nonvolatile semiconductor memory according to claim 2, wherein said first supply voltage transition detection circuit and said second supply voltage transition detection circuit respectively contain logic circuits having different logical threshold voltages.

4. A nonvolatile semiconductor memory whose contents are electrically rewritable, and in which a read operation for verification is performed after an erase operation to verify whether the operation has been accomplished correctly, the read operation for verification after the erase operation being done by applying to a indicated portion a voltage of a first verification level, which is lower than a supply voltage applied in a normal read operation, said nonvolatile semiconductor memory comprising:
   a supply voltage detection circuit which detects, at power-on, whether said supply voltage is lower than a first supply voltage transition threshold level that is higher than said first verification level, and which prohibits read operations on said nonvolatile semiconductor memory when said supply voltage is lower than said first supply voltage transition threshold level.

5. A nonvolatile semiconductor memory according to claim 1, wherein an output of said nonvolatile semiconductor memory is placed in a high impedance state when said supply voltage is lower than said first supply voltage transition threshold level.

6. A nonvolatile semiconductor memory according to claim 4, wherein an output of said nonvolatile semiconductor memory is placed in a high impedance state when said supply voltage is lower than said first supply voltage transition threshold level.

* * * * *